United States Patent [19]
Mayer

[11] 3,964,050
[45] June 15, 1976

[54] PLASMA DISPLAY PANEL

[75] Inventor: William N. Mayer, White Bear Lake, Minn.

[73] Assignee: Control Data Corporation, Minneapolis, Minn.

[22] Filed: May 21, 1975

[21] Appl. No.: 579,642

[52] U.S. Cl. .................... 340/324 M; 315/169 TV; 340/166 EL
[51] Int. Cl.² ........................................ H01J 17/48
[58] Field of Search ............ 340/324 M; 315/169 R, 315/169 TV

[56] References Cited
UNITED STATES PATENTS

| | | | |
|---|---|---|---|
| 3,619,714 | 11/1971 | Evans et al. | 315/169 TV |
| 3,704,052 | 11/1972 | Coleman | 315/169 TV |
| 3,749,972 | 7/1973 | Jule | 315/169 TV |
| 3,839,713 | 10/1974 | Urade et al. | 340/324 M |
| 3,878,430 | 4/1975 | Hirose | 315/169 TV |
| 3,898,515 | 8/1975 | Andoh et al. | 315/169 R |
| 3,914,642 | 10/1975 | Coderre et al. | 315/169 TV |

*Primary Examiner*—David L. Trafton
*Attorney, Agent, or Firm*—Robert M. Angus

[57] ABSTRACT

A plasma display panel according to this disclosure comprises a plurality of display elements having a dielectric surface upon which charges may accumulate adjacent a plurality of conductors. The conductors are supported by a single substrate in substantially coplanar arrangement so that charge accumulation occurs at different locations on the dielectric. Specifically disclosed is a serial shift display wherein data to be displayed may be inputed at one edge of the panel for display and serially shifted across the panel by selective application of sustaining signals to selected electrodes. Data may be read out of this panel from the opposite end for recirculation or other purposes.

15 Claims, 10 Drawing Figures

LOADING/SHIFTING ELEMENTS

Fig. 6

SUSTAIN CYCLES

Fig. 7

Fig. 8 READOUT

41    CELL CURRENT

42    VOLTAGE ACROSS $R_1$

45    BITS LOADED

44    TIMING PULSES

Fig.9

PLASMA DISPLAY PANEL

This invention relates to plasma display, and particularly to plasma display shift registers.

Gaseous discharge display devices (commonly referred to as "plasma displays") have, in recent years, been the subject of extensive research and development. Plasma display devices are particularly advantageous because they are relatively thin, flat panel displays, can be selectively operated to provide a glow discharge in a selected region, and have inherent memory capabilities. In U.S. Pat. No. 2,923,853, D. C. Engelbart disclosed a flat panel discharge display device in which a single glow discharge was stepped from one discrete position to another in response to an applied direct current input potential. However, the Engelbart device did not sustain or simultaneously shift a plurality of glow discharges as would be required for operation as a shift register memory or a display device with an inherent memory. In U.S. Pat. No. 3,559,190 Bitzer et al disclosed a plasma display panel wherein discrete cells containing a suitable gaseous plasma were selectively excited to provide a glow discharge with an inherent memory. In U.S. Pat. No. 3,781,600 Coleman et al. disclosed a shift register utilizing plasma display principles in which the electrodes of each cell were offset across the gaseous media so that upon proper application of phased signals, a plurality of display discharges could be sequentially stepped through the shift register. Other pertinent patents include U.S. Pat. No. 3,499,167 granted to Baker et al. and U.S. Pat. No. 3,798,502 granted to Ngo.

Typically, the electrodes of a plasma display are positioned outside of a glass tube or panel containing or enclosing an atmosphere of a specific gas, such as neon or argon or the like. Electrons are accumulated on the dielectric glass adjacent one electrode for excitation of adjacent regions of the gas for subsequent display at a lower exciting voltage. A more detailed description of the operation of such plasma display panels may be found in the above-referenced Bitzer et al and Baker et al patents. However, one of the problems associated with the plasma display panel when used as a display device resides in the fact that one of the opposing electrodes often blocked visual display of the glow discharge within the tube. To overcome this problem, Grier suggested in U.S. Pat. No. 3,603,836, an arrangement whereby one of the conductors, namely that conductor closest to the visual display, would be split in half so that the display could be seen between the two half-conductors. Similarly, Coleman suggested in his above-identified patent an arrangement whereby the opposing conductors are offset at an angle from the nominal viewing direction so that the display could be more readily seen adjacent the upper conductors. However, neither approach has been altogether successful as a large portion of visual display is blocked by the portions of the conductors between the display surface and the gas.

The present invention is directed to a shift register type of planar plasma display panel wherein all conductors are positioned on one side of the panel so that no conductors interfere with the visual display.

It is therefore an object of the present invention to provide a plasma panel display wherein all conductors are positioned on one side of the panel so that the display surface may be viewed by an operator without interference from conductors on the upper portion of the panel.

It is yet another object of the present invention to provide a shift type plasma display device wherein the glow discharge display is sequentially shifted through the panel in a selected fashion.

It is yet another object of present invention to provide a voltage scheme and apparatus for shifting a signal through the plasma device to accomplish the shift.

In accordance with the present invention, a plasma panel is provided having a plurality of elongated conductors arranged in a single plane separated from the gaseous chamber by a suitable dielectric. Preferably, the dielectric includes means comprising regions of alternately relatively high and low dielectric properties so as to form rows normal to the parallel conductors. Input electrodes are in direct contact with the gaseous media and aligned with each row along which a display is to be shifted, the input electrodes providing input to the first bit position of a display to be shifted.

One feature of the present invention resides in the provision of output electrodes, also in direct contact with the gaseous media, along each row to permit extraction of signals from the shift register.

yet another feature of the present invention resides in the provision of a single support or substrate supporting all electrodes, thereby minimizing the cost of the plasma display device by the elimination of dual printed circuits.

Yet another feature of the present invention resides in the provision of a transparent display surface whereby the gaseous discharge may be viewed and the device may operate as a display device.

The above and other features of this invention will be more fully understood from the following detailed description and the accompanying drawings, in which.

Figure 1:
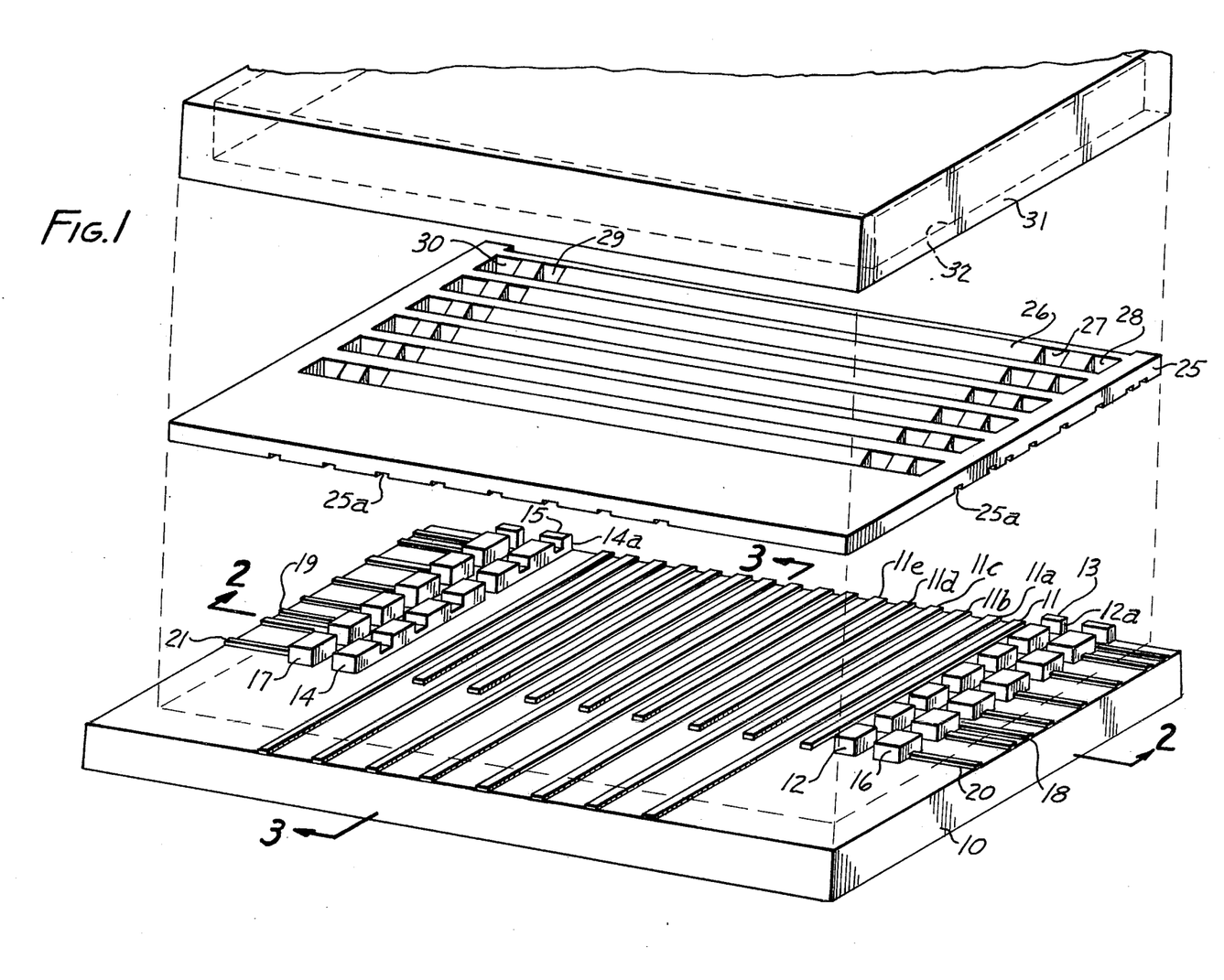
FIG. 1 is a perspective view of a portion of a plasma display panel in accordance with the presently preferred embodiment of the present invention.
Figures 2, 3:
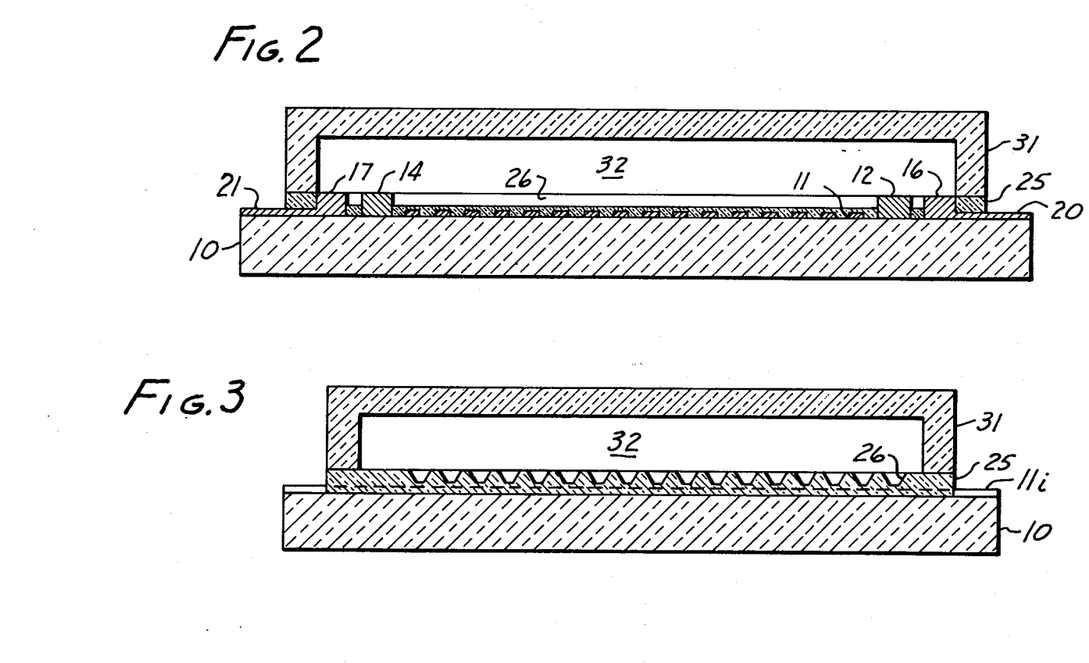
FIGS. 2 and 3 are section views taken along lines 2—2 and 3—3, respectively, in FIG. 1.
Figure 4:
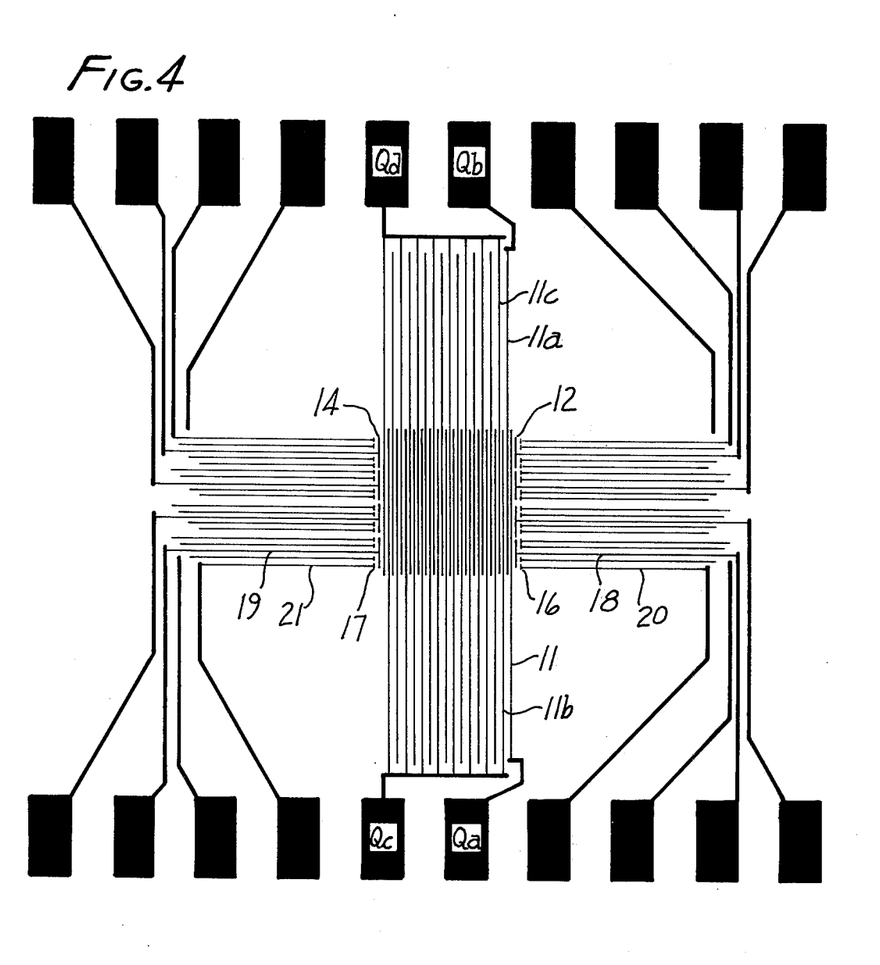
FIG. 4 is a planar view of the printed circuit arrangement of the conductors for the plasma display device illustrated in FIG. 1.

Referring to the drawings, and particularly to FIGS. 1–3, there is illustrated a planar plasma display device according to the presently preferred embodiment of the present invention. A substrate 10, preferably constructed of a suitable dielectric material, supports a plurality of parallel, elongated conductor electrodes 11, 11a, etc. As shown particularly in FIG. 4, alternate ones of elongated electrodes 11 extend to opposite sides of substrate 10. Electrodes 12, 12a, etc. are provided adjacent one of the end conductor electrodes 11 and include raised pads 13. Similarly at the opposite end, electrodes 14, 14a are provided also having raised pads 15. As shown particularly with respect to conductors 14, 14a, each of the electrodes 12, 12a and 14, 14a are arranged in groups having a common base and four raised pads 13, 15. Adjacent each raised pad and spaced therefrom by a short distance (e.g. about 5 mils) are a plurality of individual electrodes 16 and 17. It should be noted that an electrode 16 is positioned adjacent each raised pad 13 of the electrodes 12 and that an electrode 17 is positioned adjacent each raised pad 15 of the electrodes 14. Also, it should be noted that the relative heights of electrodes 16 and 17 are approximately the same as the heights of pads 13 and 15. Conductors 18 provide electrical connection from a termination pad to each electrode 12 and conductors 19 provide electrical connection from a termination pad to each electrode 14. Additionally, each individual electrode 17 and 16 is connected via suitable conductors 20 and 21 to a termination pad (not shown in FIGS. 1–3).

Positioned over substrate 10 and fixedly attached thereto is a dielectric plate 25 having suitable grooves 25a in the lower surface thereof to accommodate electrodes 11, 18, 19, 20 and 21. In the upper surface thereof, plate 25 includes a plurality of elongated slots 26 aligned with each corresponding pair of electrodes 12, 16 and 14, 17, normal to the direction of electrodes 11. Slots 26 are preferably somewhat V-shaped with a flat bottom surface spaced from the upper surfaces of electrodes 11 so that a thin wall of dielectric material is located above each conductor 11 along the length of slots 26 and a thicker wall of dielectric is located above each conductor 11 between adjacent slots 26. Also, as shown in FIGS. 2 and 3, slots 26 include apertures 27, 28, 29 and 30 adapted to receive each electrode and raised pad 12, 16, 14 and 17, respectively.

Housing 31, constructed of a suitable transparent material such as glass, is positioned over plate 25 and attached thereto to form chamber 32 between the upper wall of housing 31 and plate 25. As shown particularly in FIGS. 2 and 3, the upper wall of chamber 32 encompasses slots 26 and electrodes 12, 14, 16 and 17. Preferrably, chamber 32 is filled with a suitable neon and nitrogen gas at a pressure of approximately 1 Torr or slightly less and mixed in a ratio of approximately 9 parts neon to 1 part nitrogen.

In operation of the apparatus according to the present invention, it is well known that upon discharge of a display element, an electric charge will accumulate on the dielectric surface of glass plate 25 in accordance with voltages appearing on electrodes adjacent thereto. Thus, if a conductor 11 is more negative than an adjacent electrode 11a, a positive charge will accumulate on the dielectric surface adjacent conductor 11 while a more negative charge will accumulate adjacent electrode 11a. When the relative voltages on electrodes 11 and 11a are reversed, a discharge will occur through the gas between the two electrodes thereby causing the element to be lit, and the charges adjacent the electrodes will reverse. For details of explanation on the theory of operation of such plasma elements, reference may be had to the aforementioned Bitzer et al. and Baker et al. patents. As it explained in the aforementioned patents, once an element is excited, a residual charge from the excited element will accumulate on the dielectric surface of adjacent elements. Thus, adjacent elements may be excited by a lower voltage than necessary to excite the initial element, and hence the elements have a "memory" capability. Display of an element occurs by switching the accumulated charge between the electrodes of the element.

Figure 5:
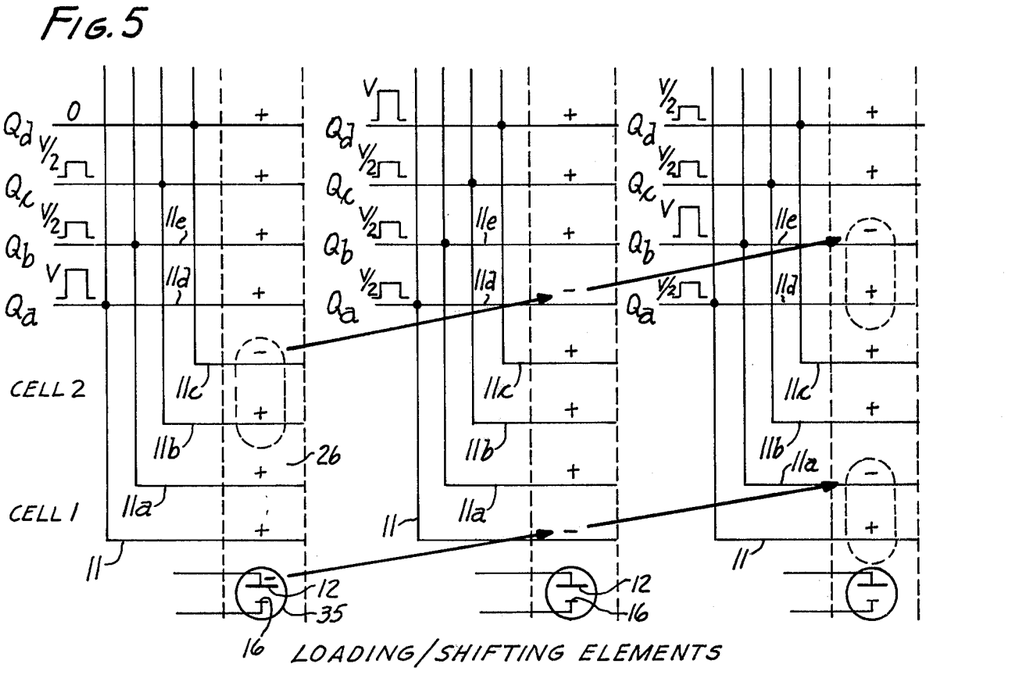
FIGS. 5–8 are illustrations useful in explaining the loading, shifting, sustaining and readout of display elements.

With reference to FIG. 5, the loading and/or shifting of a display between elements may be readily explained. In FIG. 5, an element consists of the region within any slot 26 between two adjacent electrodes 11. Thus, as illustrated in FIG. 5, a first element will consist of a region within slot 26 between electrodes 11 and 11a, a second element will consist of a region within the same slot 26 between electrodes 11b and 11c, etc. Initially, a highly positive voltage pulse is applied to electrode 16 of the discharge cell diagramatically illustrated at 35. Since contacts 12 and 16 of the trigger cell 35 are in contact with the gaseous media, cell 35 operates as a gas discharge cell, and the application of a suitable voltage causes discharge therein such that a highly negative charge is developed on electrode 12.

As is illustrated in FIG. 5, every fourth electrode is connected to a voltage source $Q_a$, $Q_b$, $Q_c$ or $Q_d$. Upon application of a large positive pulse V to electrode 11, and a positive pulse V/2 to electrode 11a, a discharge occurs between conductor 11 and electrode 12, and the positive charge previously accumulated adjacent electrode 11 in slot 26 switches to a negative charge by transfer of electrons from electrode 12 to the dielectric media adjacent electrode 11. The voltage on electrode 11 is thereafter reduced to V/2 so that the condition illustrated in FIG. 5 becomes stable. It should be noted that element 1 thus comprises a negative charge adjacent electrode 11 and a positive charge adjacent electrode 11a and a positive charge adjacent electrode 12. Thereafter a highly positive voltage V is applied to electrode 11a whereas a more negative pulse V/2 is applied to electrode 11 causing a discharge in the element between conductors 11 and 11a so that the charge adjacent electrode 11 is switched to that part of the dielectric adjacent electrode 11a and the positive charge adjacent conductor 11a is switched to that portion of the dielectric adjacent electrode 11. Element 1 is therefore ignited.

Similarly, assuming element 2 was already excited prior to loading of element 1 such that the charge on the dielectric adjacent electrode 11c is negative and the charge adjacent electrode 11b is positive, the application of a 0 voltage signal to electrode 11c from voltage source $Q_d$ together with the simultaneous application of a highly positive voltage V to electrode 11d from source $Q_a$ causes the negative charge adjacent electrode 11c to be transferred to that portion of the dielectric adjacent electrode 11d. The third element is stabilized by V/2 signal to electrode 11d and 11e to stabilize a positive charge adjacent to electrode 11e and a negative charge adjacent electrode 11d. Upon application of a highly positive voltage pulse V from source $Q_b$ to electrode 11e and the more negative pulse V/2 to electrode 11d, the third element discharges causing the negative charge to be transferred to that portion of the dielectric adjacent electrode 11e and the positive charge to be transferred to that portion of the dielectric adjacent electrode 11d.

Assuming the elements are properly loaded with the desired charges, it now becomes necessary to sustain those charges in order to view the discharge. Thus, with reference to FIG. 6, the sustain cycles may be readily explained. Assuming both the first and second elements are excited such that the charge adjacent electrode 11 is positive, the charge adjacent electrode 11a is negative, the charge adjacent 11b is positive and the charge adjacent electrode 11c is negative, upon application of pulses from sources $Q_d$ and $Q_c$ of V/2, the charge on element 2 remains the same. However, upon application of a 0 voltage to electrode 11a and a highly positive voltage V to electrode 11, element 1 discharges causing the charge in element 1 to switch. During the next cycle, the voltage on electrode 11 is lowered to V/2 and the voltage on electrode 11a is raised to V/2. Since the voltages across the element are the same, the charge does not change and the element is not sustained. However, the voltage on electrode 11b is raised to V and the voltage on electrode 11c is lowered to 0, causing the element 2 to discharge thereby igniting or sustaining element 2 and reversing its charges. During the next cycle, the voltage on electrode 11 is lowered to 0 while the voltage on electrode 11a is raised to V, thereby discharging element 1 and reversing its charges, and the voltage on electrode 11b is lowered to V/2 while the voltage on electrode 11c is raised to V/2, thereby not sustaining or igniting element 2. During the fourth cycle, the voltages on electrodes 11, 11a, 11b and 11c are altered to V/2, V/2, 0 and V respectively, thereby igniting element 2. The cycles continue, alternately switching one element and then the other through operation of the device.

Figure 6:
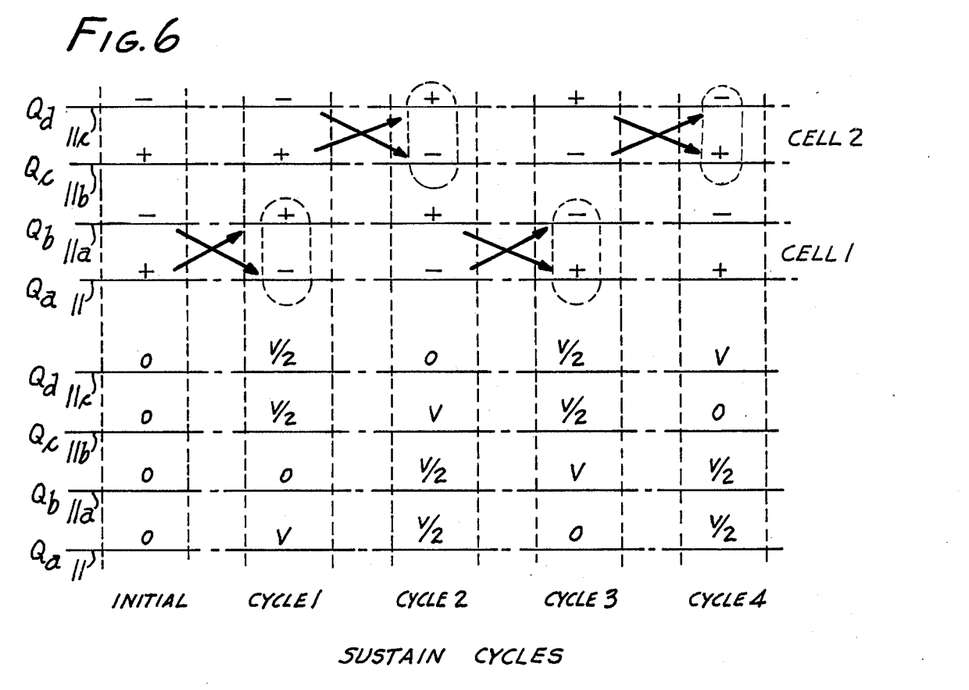

It should be recognized that the provision of the half-voltages (V/2) to the unsustained elements adjacent a sustained element effectively isolates the sustained elements to assure that the charge transfers (switching) is confined to a single element and does not exchange charges between adjacent electrodes of adjacent elements.

Figure 7:
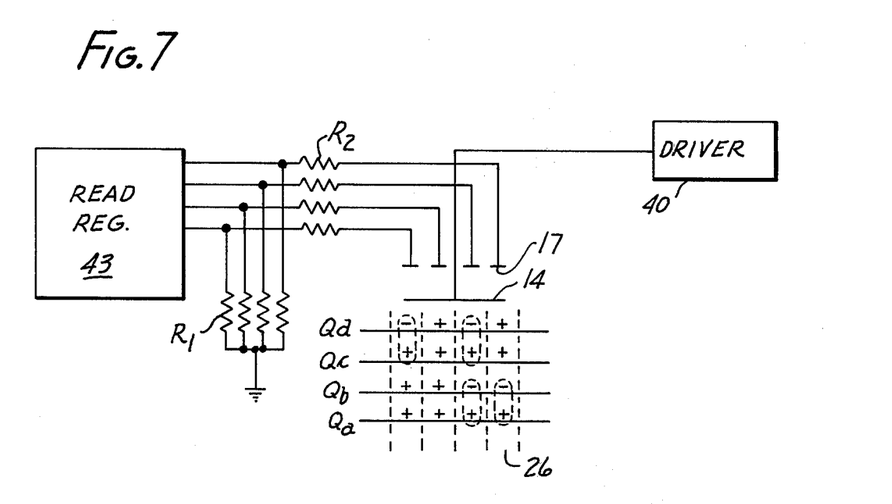
Figure 8:
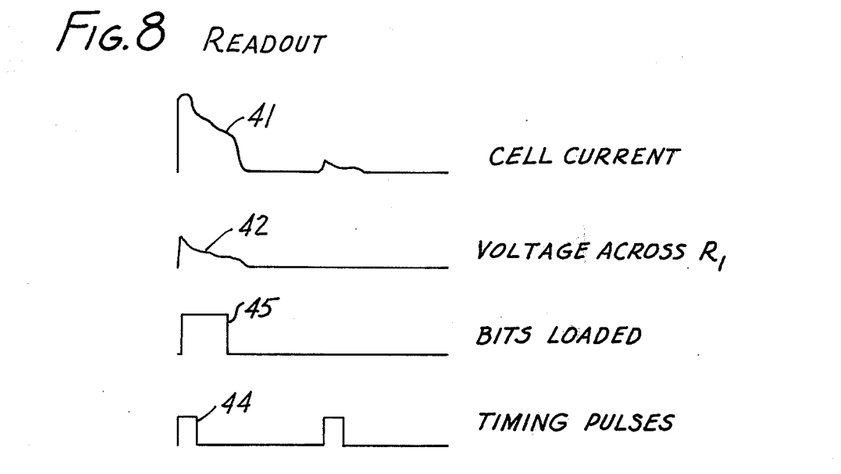

With reference to FIGS. 7 and 8, readout of the plasma panel can be readily described. FIG. 7 shows the last two elements of each of four rows of a panel, each row being delineated by a slot 26. As shown in FIG. 7, the last element of the first row, is lit, the last two elements of the third row are lit, and the penultimate element of the fourth row is lit. Thus, the data represented at the last elements of the four rows is 1010 and the data represented at the penultimate elements is 0011. To read the line, a high voltage V is applied to electrode 14. If a negative charge exists on the dielectric adjacent line $Q_d$ (as would be the case of a lit element), the positive voltage on electrode 14 will attract the negative charge causing a discharge to occur in the output line between the respective electrode 17 and electrode 14. On the other hand, if a positive charge exists adjacent conductor $Q_d$ when a positive voltage is placed on electrode 14 (as would be the case in an unlit element) no discharge occurs between the respective electrode 17 and the electrode 14.

Electrodes 14 and 17 comprise individual discharge cells. Upon discharge of a cell existing between electrode 14 and a respective one of electrodes 17, a cell current illustrated by waveform 41 in FIG. 8 is transferred through current limiting resistor $R_2$ to form a voltage drop across a respective resistor $R_1$, shown by waveform 42 in FIG. 8. Voltage waveform 42 is supplied as an input to read register 43 which, when activated by a suitable timing pulse 44, reads and stores a bit signal 45 indicative of a binary 1. On the other hand, if no discharge occurred in the cell as illustrated in the center portion of FIG. 8, a very small cell current exists in the cell formed by electrodes 14 and 17 so that virtually no voltage drop occurs across the respective $R_1$ so that a binary 0 is loaded into read register 43.

Figure 9:
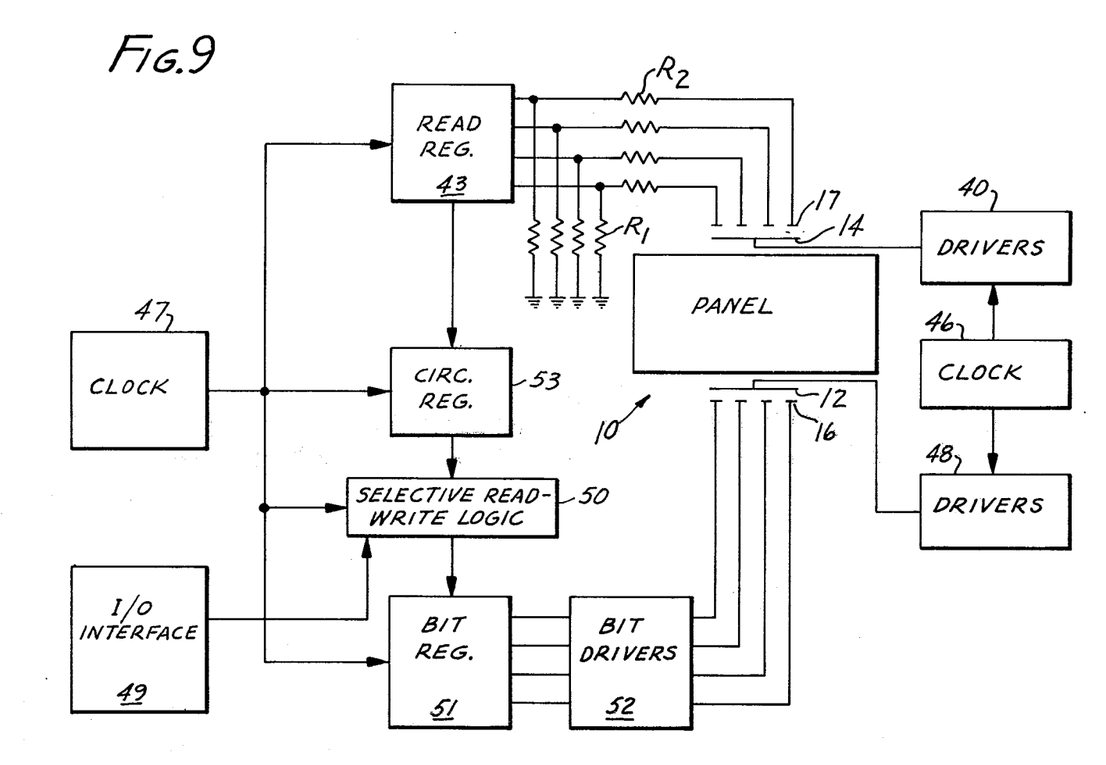
FIG. 9 is a block circuit diagram of apparatus for recycling data from the display panel.

As shown particularly in FIG. 9, readout from the panel can be utilized as a recirculating data display. Thus, a clock 46, synchronized with clock 47, conditions drivers 40 and 48 to selectively operate and apply a positive voltage to selective ones of group electrodes 12 and 14. Data may be supplied from an input/output interface device 49 to logic circuit 50 which in turn supplies binary information into bit register 51 for operating bit drivers 52 to supply selected signals to selected ones of electrodes 16 to load information into the display panel 10 as heretofore described. The data may be shifted and read out as heretofore described into read register 43 which forwards the binary information to circulating register 53 forinput to selective read/write logic circuit 50. Preferably, and as illustrated in FIG. 9, clock 47 synchronizes operation of read register 43, logic 50, bit register 51 and circulating register 53. Depending upon the manner by which logic circuit 50 is set, as established by the interface 49, the data from read register 43 may be recirculated to bit register 51 to be reinserted into display panel 10, either on the same line as from where it came, or a different one. Alternatively, new data may be read onto the panel.

Figure 10:
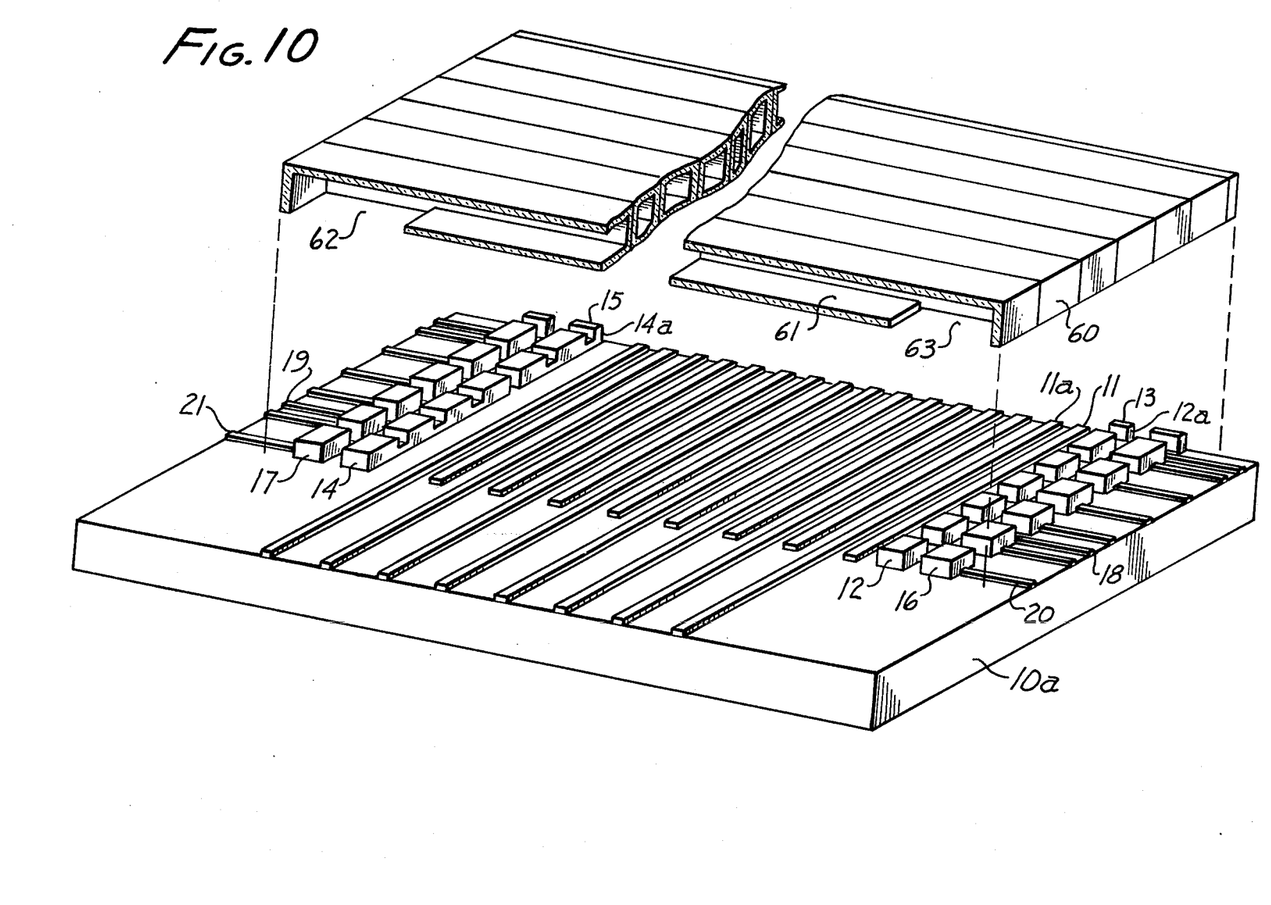
FIG. 10 is a perspective view of a portion of a plasma display panel according to a modification of the present invention.

FIG. 10 illustrates a plasma display panel according to a modification of the present invention wherein tubular elements are used in lieu of a single display chamber. The lower portion of the panel 10a, illustrated in FIG. 10, consisting of the substrate, conductors and electrodes, is substantially the same as that illustrated in FIG. 1 and therefore need not be described in further detail. The display structure, however, comprises a plurality of substantially rectangular tubes 60 constructed of glass and having a width of about 30 mils and a heighth of about 12 mils. Tubes 60 are closed at both ends to form individual elongated chambers 61 defining each row between respective electrodes 12, 14, 16 and 17. Preferably, the walls of each tube are approximately 3 mils thick so that the interior dimensions of the chamber 61 are approximately 24 by 6 mils. Preferably, and as illustrated in FIG. 10, a slot 62 and 63 is formed at each end of each tube to accommodate the electrodes 14, 17 and 12, 16. Tubes 60 are positioned in side by side relationship and fastened to substrate 10a by suitable bonding techniques well known in the art to seal each tube. As heretofore described, each tube contains an atmosphere of gas, such as approximately 9 parts neon to 1 part nitrogen at a pressure of approximately 1 Torr or less.

The apparatus illustrated in FIG. 10 operates in substantially the same manner as the apparatus shown in FIG. 1, and need not be described in detail. In essence, however, display is shifted along each tube as heretofore described.

The present invention thus provides a serial shift plasma panel capable of inputting and circulating data for memory and/or display purposes. One feature of the present invention resides in the fact that all electrodes necessary for sustaining and shifting a display are positioned on the same substrate, thereby minimizing the cost of fabricating substrates and printed circuits. A display panel according to the present invention is effective in operation and provides a useful display and/or memory panel which is easily maintained, rugged in use, and less costly than prior display devices of similar class.

This invention is not to be limited by the embodiments shown in the drawings and described in the description, which are given by way of example and not of limitation, but only in accordance with the scope of the appended claims.

What is claimed is:

1. A display device having a plurality of display elements, said display device comprising a substrate supporting a plurality of elongated conductors in a substantially planar array, each of said conductors being substantially parallel to the others of said conductors; a plurality of first cell means adjacent an end one of said conductors, each of said first cell means including first and second electrodes; dielectric means overlying said conductors, said dielectric means having a plurality of elongated surfaces extending substantially normal to the length of said conductors, one end of each of said surfaces being adjacent to a respective one of each of said first cell means; confining means for confining a gaseous atmosphere contiguous to said dielectric surfaces and said first cell means, each of said display elements being defined by a region of each of said dielectric surfaces between respective pairs of said conductors, whereby upon application of a discharge potential to a first cell means and a selected shift voltage to the one conductor adjacent said first cell means, said respective first cell means discharges to transfer a charge to the dielectric surface adjacent the said one conductor adjacent said first cell means and whereby upon application of a display voltage to the pair of conductors of a display element, a charge difference accumulated on the dielectric surface adjacent said pair of conductors initiates a discharge in said gaseous atmosphere to reverse the charge accumulation and to sustain display of said element.

2. Apparatus according to claim 1 wherein said elongated dielectric surfaces are arranged in substantially parallel rows normal to the length of said conductors, each of said first cell means comprising a gas discharge cell adjacent an end of a respective row.

3. Apparatus according to claim 2 wherein said first cell means are supported by said substrate.

4. Apparatus according to claim 3 wherein said first electrode is common to more than one of said first cell means and said second electrodes comprise individual electrodes unique to each individual first cell means.

5. Apparatus according to claim 1 further including first circuit means for applying a selected discharge current to each respective first cell means.

6. Apparatus according to claim 1 further including second circuit means for selectively applying a selected display voltage to each of said conductors.

7. Apparatus according to claim 1 wherein said rows are separated by a dielectric barrier.

8. Apparatus according to claim 7 wherein dielectric means comprises a substantially planar layer of dielectric material disposed over said conductors, said dielectric surfaces and dielectric barriers being formed by grooves formed in a surface of said material opposite said conductors so that the bottoms of said grooves form said dielectric surfaces upon which charges accumulate and the material between said grooves forms said dielectric barriers.

9. Apparatus according to claim 7 wherein said confining means comprises a plurality of elongated tubes constructed by dielectric material, said tubes being aligned normal to said conductors and having a bottom wall over-lying said conductors to form said dielectric surface, the side walls of said tubes together forming said dielectric barriers.

10. Apparatus according to claim 1 further including a plurality of second cell means adjacent an end one of said conductors opposite the first-named end conductor, each of said second cell means including third and fourth electrodes, each of said second cell means being adjacent an end of each of said dielectric surfaces opposite said first-named end and being contiguous to said gaseous atmosphere confined by said confining means.

11. Apparatus according to claim 10 further including third circuit means for applying a selective discharge potential to each of said second cell means, said third circuit means including detecting means for detecting the discharge occurring in each of said second cell means, whereby the polarity of charge accumulation on the dielectric surface adjacent said last-named end conductor can be read out.

12. Apparatus according to claim 11 further including data input means for selectively applying discharge currents to selected ones of said first cell means.

13. Apparatus according to claim 12 wherein said data input means is connected to said detecting means, whereby data read out through selected ones of said second cell means may be recirculated through the display device.

14. A display device comprising dielectric means having a substantially planar surface; envelope means contiguous said dielectric means to form an enclosed chamber between said dielectric means and said envelope means, said chamber being contiguous said surface; a gaseous atmosphere within said chamber; a plurality of elongated conductors arranged in a substantial coplanar, parallel array adjacent said surface and outside of said chamber; select means for selectively applying voltages to selected conductors to sustain a display by reversing any charge accumulated on said dielectric means between two adjacent conductors; a plurality of first cell means in said chamber and adjacent the portion of said surface adjacent an end one of said conductors; means for applying a discharge potential to selected ones of said first cell means to transfer a charge to the portion of said surface adjacent the selected first cell means; and dielectric barrier means supported on said surface normal to said elongated conductors, said dielectric barrier means forming a plurality of rows normal to said conductors each terminating adjacent one of said first cell means.

15. Apparatus according to claim 14 further including a plurality of second cell means, each adjacent the end of said rows opposite said first cell means, means for applying a discharge potential to said second cell means to detect the charge accumulated on said surface adjacent said second cell means.

* * * * *